(12) United States Patent
Westra et al.

(10) Patent No.: US 7,135,942 B2
(45) Date of Patent: Nov. 14, 2006

(54) INTERPOLATING PROGRAMMABLE GAIN ATTENUATOR

(75) Inventors: Jan R Westra, Uithoorn (NL); Jan Mulder, Houten (NL)

(73) Assignee: Broadcom Corporation, Irvine, CA (US)

( * ) Notice: Subject to any disclaimer, the term of this patent is extended or adjusted under 35 U.S.C. 154(b) by 81 days.

(21) Appl. No.: 10/694,952

(22) Filed: Oct. 29, 2003

(65) Prior Publication Data

US 2005/0093643 A1    May 5, 2005

(51) Int. Cl.
*H03H 7/24*    (2006.01)
*H03G 3/10*    (2006.01)
(52) U.S. Cl. .................. 333/81 R; 330/284; 327/308
(58) Field of Classification Search .......... 333/81 R; 330/278, 284; 327/308
See application file for complete search history.

(56) References Cited

U.S. PATENT DOCUMENTS 6,175,278 B1 *   1/2001   Hasegawa ............... 330/278
6,472,940 B1    10/2002   Behzad et al.
6,545,620 B1 *   4/2003   Groeneweg ............. 341/139
2005/0168279 A1  8/2005   Behzad

* cited by examiner

*Primary Examiner*—Stephen E. Jones
(74) *Attorney, Agent, or Firm*—Sterne, Kessler, Goldstein & Fox P.L.L.C.

(57) ABSTRACT

A programmable gain attenuator includes a termination resistor. A first termination switch connects one side of the termination resistor to a first output. A second termination switch connects another side of the termination resistor to a second output. A first resistor ladder is arranged between a first input and the first side of the termination resistor. A first plurality of switches connect a corresponding tap from the first resistor ladder to the first output. A second resistor ladder is arranged between a second input and the second side of the termination resistor. A second plurality of switches connect a corresponding tap from the second resistor ladder to the second output. A first switch of the first plurality of switches is turned on, followed by a second switch of first plurality of switches turned off, followed by a third switch of first plurality of switches turned on. A first switch of the second plurality of switches is turned on, followed by a second switch of second plurality of switches turned off, followed by a third switch of second plurality of switches turned on.

11 Claims, 5 Drawing Sheets

US 7,135,942 B2

INTERPOLATING PROGRAMMABLE GAIN ATTENUATOR

BACKGROUND OF THE INVENTION

1. Field of the Invention

The present invention relates to an interpolating programmable gain attenuator used in analog front ends.

2. Related Art

Broadband digital communication chips, such as cable modems and Ethernet chips, generally incorporate an analog front-end (AFE) on the chip, that comprises of an analog-to-digital converter (ADC) preceded by a programmable gain attenuator (PGA). The function of the PGA is to optimally use the dynamic range of the ADC.

FIG. 1 shows a conventional PGA. This circuit comprises a linear resistive attenuator (a resistive ladder), and is fully differential. The differential input voltage, denoted by vip and vin, is applied at the input of the PGA. Switches $M_1$, $M_2$, $M_3$, . . . $M_n$ (here, NMOS transistors, although PMOS transistors, or CMOS transmission gates, i.e., both an NMOS and PMOS transistor in parallel, can also be used) connect to all of the 'taps' of the PGA. On each side of the PGA, all-but-one switches $M_1$, $M_2$, $M_3$, . . . $M_n$ are 'off'. The one pair of switches that is 'on', determines the magnitude of the differential output voltage, denoted by vop and von.

The size of the switches $M_1$, $M_2$, $M_3$, . . . $M_n$ is, in general, mainly determined by noise. To achieve low-noise performance, the on-resistance $r_{on}$ of the switches $M_1$, $M_2$, $M_3$, . . . $M_n$ has to be low. As a consequence, switches with a large width have to be used. Unfortunately, large switches introduce substantial parasitic capacitances, decreasing the achievable bandwidth of the PGA. Furthermore, the chip area of the PGA can become quite large. Since the PGA is integrated on-chip, the chip area occupied by the PGA is an important factor, i.e., lower area means lower cost.

FIG. 2 shows an improved conventional PGA, where always M pairs of consecutive switches are turned 'on' simultaneously (in FIG. 2, M=4). As a result, the switches can be M times less wide compared to the circuit shown in FIG. 1, improving both the bandwidth and area of the PGA.

The PGA is used to attenuate an input voltage arranging from, e.g., 100 millivolts to 4 volts down to a set value of 100 millivolts, e.g. Thus, in the PGA shown in FIGS. 1 and 2, by turning on a successive switch, the output voltage is gradually increased. The input voltage to the gates of the switches are usually digitally controlled.

The parasitic capacitance of the switches is usually dominant compared to the parasitic capacitance of the resistors. Typical parasitic capacitance of the switches is about 10–20 femtofarads. A typical value of each resistor $R_1$ is several ohms. Typical dimensions for a resistor are about half a micron wide by a few microns long. The dimensions of the switches depend on process parameters, such as gate length (currently, about 0.09–0.35 microns). Typical value of the gate width is approximately 10–20 microns wide.

The PGA is used to attenuate the amplitude of the signal entering an amplifier or an A/D converter and often has as many as 500+ steps. Thus, using the structure illustrated in FIG. 1, for a 500 step PGA, 500×2 switches $M_1$, $M_2$, $M_3$, . . . $M_{500}$ and 500×2 resistors $R_1$ need to be used. This requires a substantial area on the chip, e.g., 300×600 microns. Furthermore, because of the number of resistors and switches, they are usually not laid out in a straight line but are instead "folded" or laid out in zig zag pattern. The wiring trace length at the turning point of the zig zag pattern is longer than trace length elsewhere, introducing additional layout difficulties and potentially reducing the accuracy of the PGA. Also, the extra lengths of the trace at the zigzag can decrease the bandwidth of the PGA at that particular setting.

SUMMARY OF THE INVENTION

The present invention is directed to a programmable gain attenuator that substantially obviates one or more of the problems and disadvantages of the related art.

Accordingly, there is provided a programmable gain attenuator including a termination resistor. A first termination switch connects one side of the termination resistor to a first output. A second termination switch connects another side of the termination resistor to a second output. A first resistor ladder is arranged between a first input and the first side of the termination resistor. A first plurality of switches connect a corresponding tap from the first resistor ladder to the first output. A second resistor ladder is arranged between a second input and the second side of the termination resistor. A second plurality of switches connect a corresponding tap from the second resistor ladder to the second output. A first switch of the first plurality of switches is turned on, followed by a second switch of first plurality of switches turned off, followed by a third switch of first plurality of switches turned on. A first switch of the second plurality of switches is turned on, followed by a second switch of second plurality of switches turned off, followed by a third switch of second plurality of switches turned on.

Additional features and advantages of the invention will be set forth in the description that follows, and in part will be apparent from the description, or may be learned by practice of the invention. The advantages of the invention will be realized and attained by the structure particularly pointed out in the written description.

It is to be understood that both the foregoing general description and the following detailed description are exemplary and explanatory and are intended to provide further explanation of the invention.

BRIEF DESCRIPTION OF THE DRAWINGS/FIGURES

The accompanying drawings, which are included to provide a further understanding of the exemplary embodiments of the invention and are incorporated in and constitute a part of this specification, illustrate embodiments of the invention and together with the description serve to explain the principles of the invention. In the drawings.

DETAILED DESCRIPTION OF THE INVENTION

Reference will now be made in detail to the embodiments of the present invention, examples of which are illustrated in the accompanying drawings.

Figure 2:
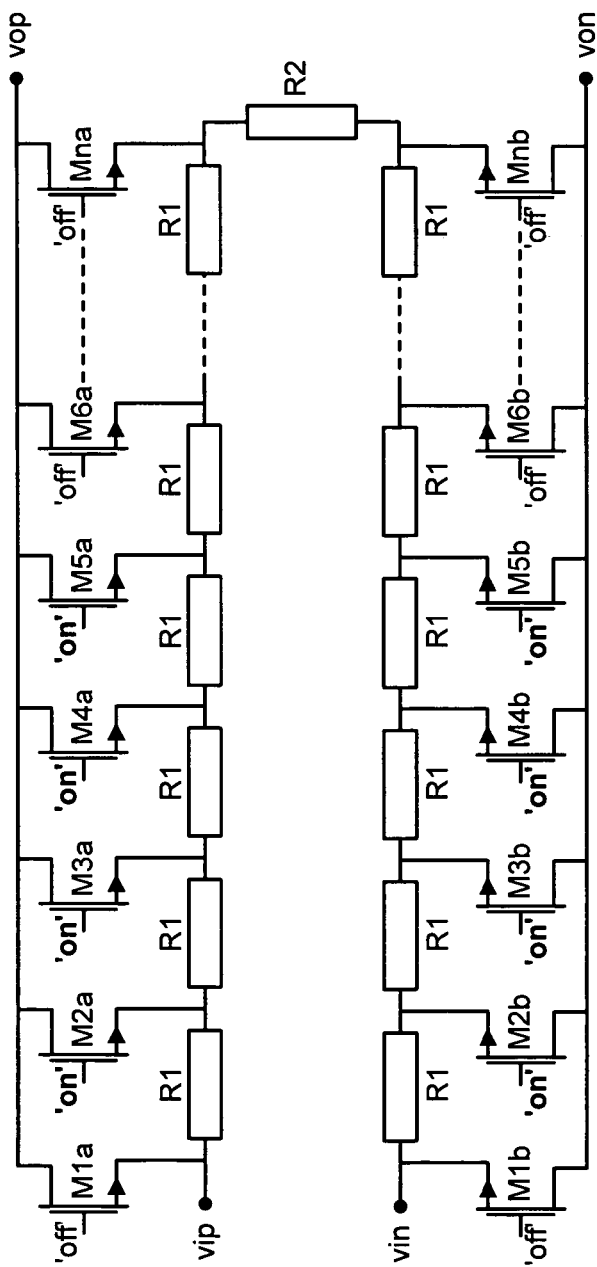
FIG. 2 shows an improved conventional PGA.
Figure 3A:
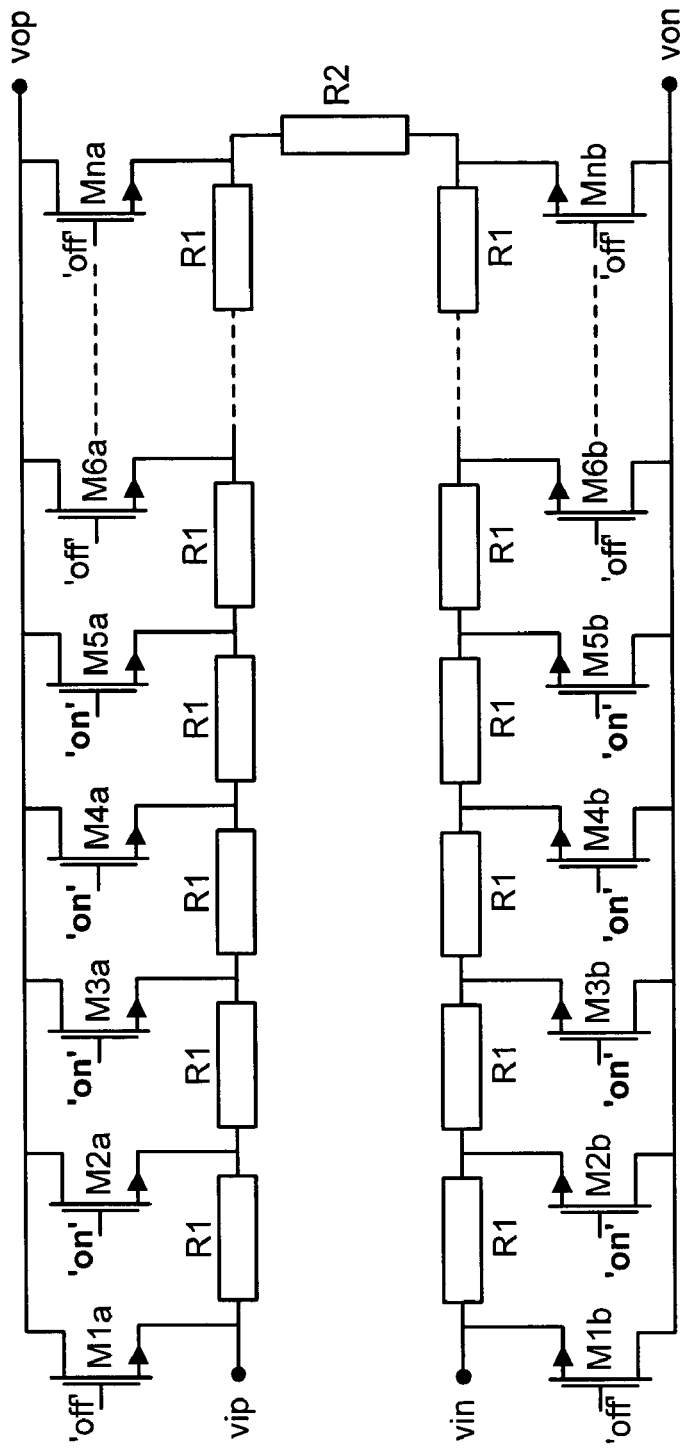
FIGS. 3A–3C show a PGA of the present invention.
Figure 3B:
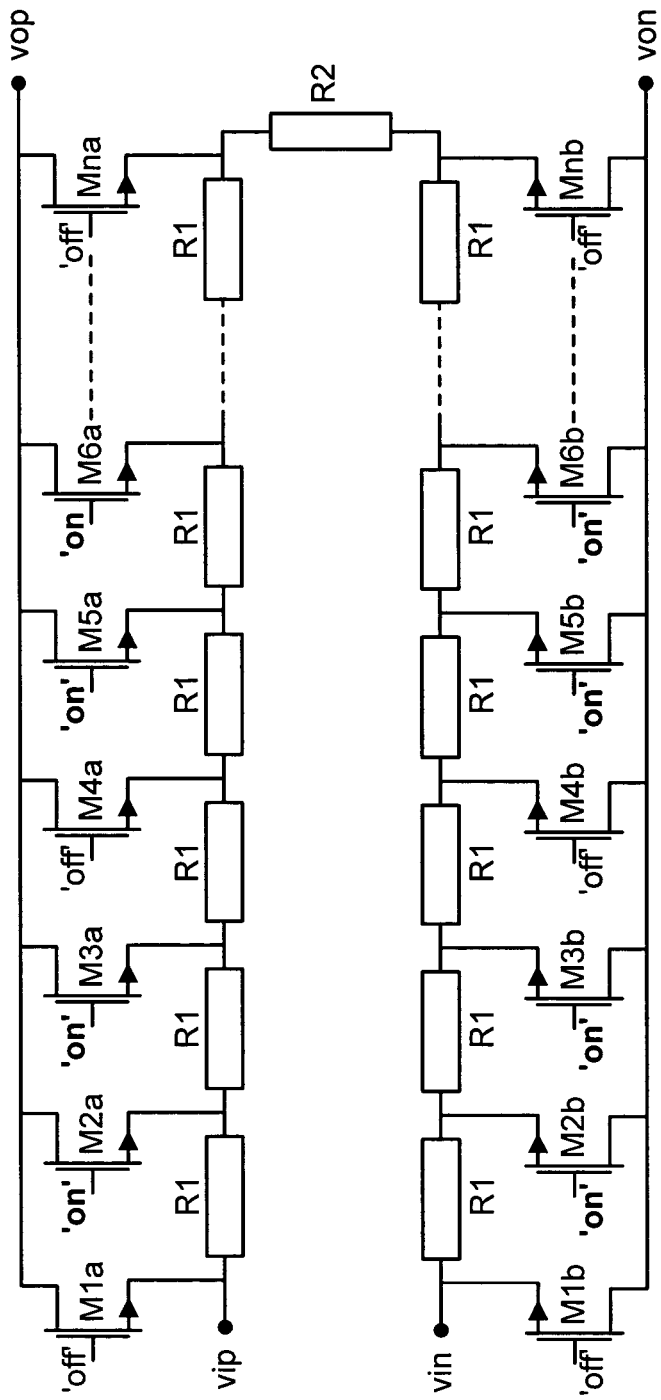
Figure 3C:
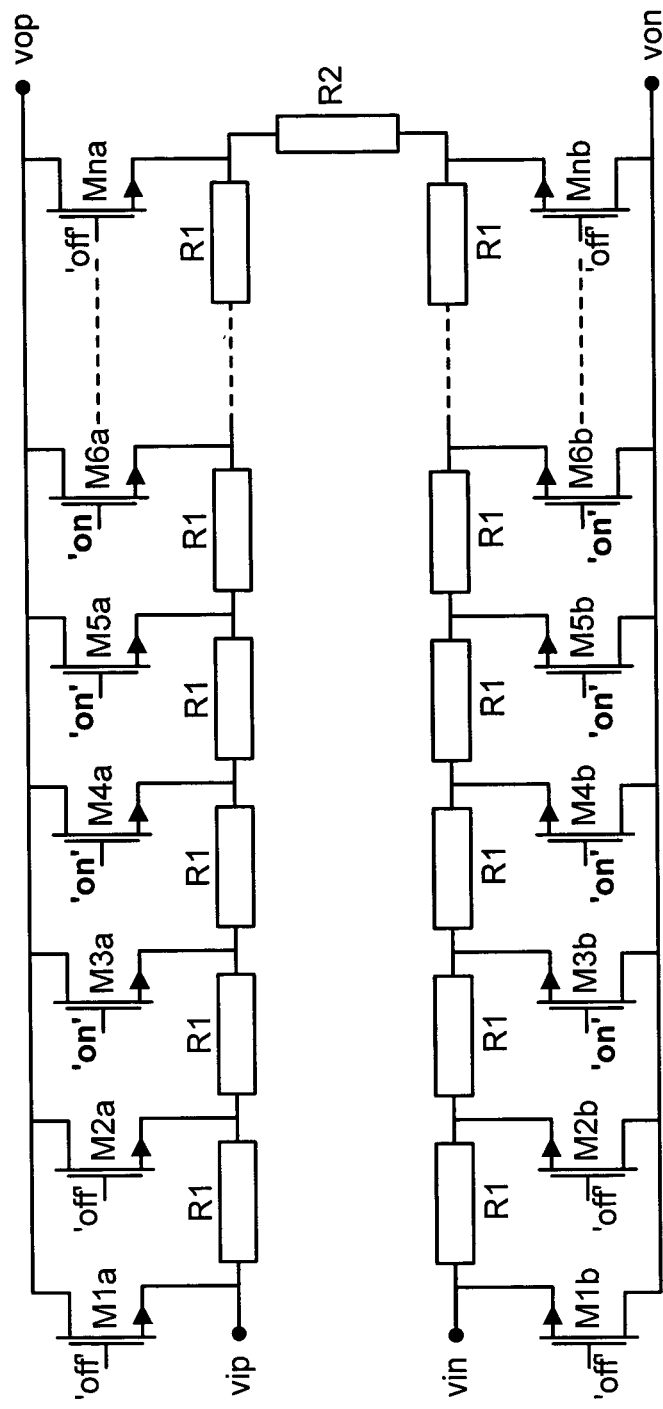

This invention proposes a further improvement with respect to the conventional PGA shown in FIG. 2. The proposed PGA circuit is depicted in FIG. 3 and can be used in any AFE application. An example of a PGA circuit is described in commonly assigned U.S. patent application Ser. No. 09/712,422, filed Nov. 13, 2002, entitled, GIGABIT ETHERNET TRANSCEIVER WITH ANALOG FRONT END, which is incorporated by reference herein. The PGA uses the switches to interpolate between different taps of the resistive divider. This is accomplished by turning switches 'on' that are not consecutive. In other words, consecutive switches are turned on, followed by one or more switches off, followed by more consecutive switches on. FIGS. 3A–3C show three settings of the PGA. In two PGA states shown in FIGS. 3A and 3C, switches $M_2$ through $M_5$, and $M_3$ through $M_6$, are turned 'on' respectively. In the PGA setting shown in FIG. 3B, switches $M_2$, $M_3$, $M_5$ and $M_6$ are turned 'on'. Thus, the setting shown in FIG. 3B interpolates between the two settings shown in FIGS. 3A and 3C.

Further interpolation can be achieved by turning on switches $M_2$, $M_3$, $M_4$ and $M_6$, interpolating between the settings shown in FIGS. 3A and 3B. Also, switches $M_2$, $M_4$, $M_5$ and $M_6$, can interpolate between the settings shown in FIGS. 3B and 3C.

The PGA also incorporates a digital decoder (not shown in the figures) that determines which switches are to be turned on for a certain PGA setting.

This interpolation works on condition that the on-resistance $r_{on}$ of the individual switches $M_1$, $M_2$, $M_3$, ... $M_n$ is greater than the unit resistance $R_1$ of the PGA. Usually, this is not a limitation in practice.

The proposed PGA has several advantages. First, the PGA uses fewer switches. This reduces both the chip area and the total parasitic capacitance introduced by the switches. Lower parasitic capacitance results in a higher PGA bandwidth. Secondly, the PGA requires less taps, and therefore, less resistors, further decreasing the chip area of the PGA.

For example, in the PGA circuit shown in FIGS. 3A–3C, 4× less switches and resistors $R_1$ are required, while the resistance of $R_1$ can be increased by a factor of 4.

Note that the possibilities for doing interpolation increase with the number of switches being turned 'on' simultaneously. So, in general, the possible improvement of bandwidth and area is larger when, e.g., 16 switches are always 'on' versus 4 switches always 'on'.

Other alternatives include settings where, e.g., $M_1$, $M_4$, $M_5$, and $M_6$ are turned 'on', or, e.g., $M_2$, $M_4$, $M_6$ and $M_7$ are turned 'on'. That is, more than one switch is turned 'off' between the left-most and right-most switches turned 'on'. The switches that are turned 'off' in-between the 'on'-switches also do not have to be consecutive.

With further reference to FIGS. 3A–3C, it will be appreciated that although only four switches are shown turned on at any given time, a different number of switches may be turned on, e.g., M=8 switches or M=16 or some other number. The number of the switches needed by the PGA therefore decreases. If N is the total number of steps in a PGA, and M is the number of switches turned on at any given time, then the overall number of switches needed by the PGA is approximately 2×N/M, plus approximately 2×M switches to account for the border cases. For M<<N, the overall reduction in the number of switches is roughly N. It follows therefore that, at least theoretically the optimum number of switches being turned on is M=√N. In practice, this is not quite accurate, due to the non-linearity of the on-resistance $r_{on}$ of the individual switches $M_1$, $M_2$, $M_3$, . . . $M_n$. As a result of this non-linearity, the PGA output signal will always be slightly distorted. This harmonic distortion increases with the difference in signal amplitude among the source terminals of the M switches being turned on. The amount of distortion that is allowed is application-dependent. Note also that with the approach just described, the step size may be different, in other words, the options for interpolation may increase. As an example, for a 512 step PGA (N=512), a practical value for M is about 16–18.

Additionally, in FIGS. 3A and 3C, four switches are on, and one is off, an alternative arrangement may be used where two switches in the middle are off, surrounded by two switches on one side and two switches on the other side (or some other number depending on M). Similarly, some other number of switches that are turned off while being surrounded by other "on" switches may be used, e.g., 3 or 4 or some other number. Furthermore, it is possible to combine cases where only one switch is off, e.g., FIG. 3B, with cases where one switch is on, and one switch is off, as described above. This can reduce the number of switches and resistors needed by the PGA somewhat, although some of the values are duplicative between the various approaches.

Figure 1:
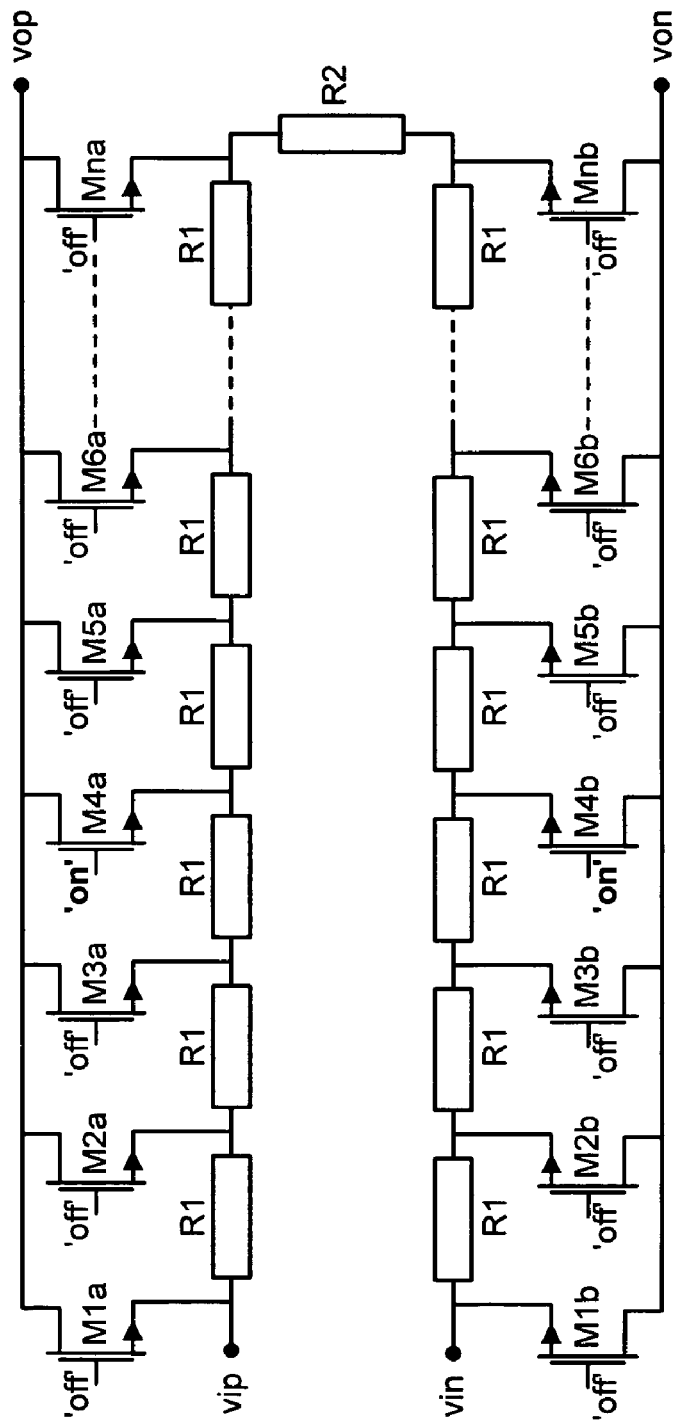
FIG. 1 shows a conventional PGA.

The area reduction using this approach scales approximately with M. Thus, for the 4× case (M=4) shown in FIGS. 3A–3C, the overall area used by the PGA is approximately ¼ (perhaps slightly more than one quarter) of the area utilized in the Conventional PGA described with reference to FIGS. 1 and 2.

Thus, with reference to FIGS. 3A, 3B and 3C, if the amplitude of the output signal of FIG. 3A is 4.1 volts, and the output of FIG. 3C is 4.0 volts, the amplitude of the output signal of FIG. 3B would be 4.05 volts.

The value of $R_2$ can be the same, or approximately the same as $R_1$ for a linear PGA. For a logarithmic, or linear-in-dB, $R_2$ is usually approximately the value of the characteristic impedance.

It will also be appreciated that the greater the complexity of turning the switches on and off (in other words the more variations there are in how the various combinations of consecutive transistors are turned on and off together, the more complex the encoder/controller for PGA operation needs to be).

The improvement in bandwidth due to the parasitic capacitance reduction also scales roughly with M. Thus, for a nominally 50 MHz device, and M=4, the bandwidth of the device increases to approximately 200 MHz.

The invention can also be applied to logarithmic PGAs, also known as 'linear-in-dB' PGAs. In a logarithmic PGA, there is not only a termination resistor R2 at the end of the left and right resistive dividers, but there are also several additional resistors connected between corresponding taps of the left and right dividers. The value of the additional resistors is typically a little higher than the value of R2. Another way to describe the logarithmic PGA is as a cascaded version of the PGA is described in the application.

The invention can also be applied to a D/A converter as follows: a DC reference voltage is applied to the PGA. This DC voltage is then divided by the resistor ladder. The digital input word of the D/A converter, through a digital decoder, determines which switches will be turned on/off. The invention, using interpolation, can be used to reduce the number of switches and number of taps on the resistive divider needed for a particular D/A converter.

Conclusion

While various embodiments of the present invention have been described above, it should be understood that they have been presented by way of example, and not limitation. It will be apparent to persons skilled in the relevant art that various changes in form and detail can be made therein without departing from the spirit and scope of the invention.

What is claimed is:

1. A single-ended programmable gain attenuator comprising:

a resistive ladder;

a plurality of switches corresponding to the resistive ladder and each connected to corresponding taps of the resistive ladders and to an output;
a termination resistor,
wherein non-consecutive switches in the plurality of switches are turned on to interpolate a desired voltage at the output, wherein at least one switch between said non-consecutive switches is turned off.

2. A programmable gain attenuator comprising:
two resistive ladders;
a plurality of switches corresponding to each resistive ladder and each connected to corresponding taps of the two resistive ladders and to an output;
a termination resistor,
wherein non-consecutive switches in each of the plurality of switches are turned on to interpolate a desired voltage at the output, wherein at least one switch between said non-consecutive switches is turned off.

3. A single-ended programmable gain attenuator comprising:
a termination resistor;
a termination switch connecting one side of the termination resistor to an output;
a resistor ladder arranged between an input and the one side of the termination resistor; and
a plurality of switches each connecting a corresponding tap from the resistor ladder to the output,
wherein a first switch of the first plurality of switches is turned on, a second switch of the first plurality of switches turned off, a third switch of the first plurality of switches turned on;
wherein the first switch, the second switch, and the third switch are consecutively arranged, wherein the second switch is disposed in-between the first switch and the third switch.

4. The single-ended programmable gain attenuator of claim 3, wherein the first switch of the plurality of switches includes a plurality of switches.

5. The single-ended programmable gain attenuator of claim 3, wherein the second switch of the plurality of switches includes a plurality of switches.

6. The single-ended programmable gain attenuator of claim 3, wherein the third switch of the plurality of switches includes a plurality of switches.

7. A programmable gain attenuator comprising:
a termination resistor;
a first termination switch connecting one side of the termination resistor to a first output;
a second termination switch connecting another side of the termination resistor to a second output;
a first resistor ladder arranged between a first input and the first side of the termination resistor;
a first plurality of switches each connecting a corresponding tap from the first resistor ladder to the first output;
a second resistor ladder arranged between a second input and the second side of the termination resistor; and
a second plurality of switches each connecting a corresponding tap from the second resistor ladder to the second output,
wherein a first switch of the first plurality of switches is turned on, followed by a second switch of the first plurality of switches turned off, followed by a third switch of the first plurality of switches turned on, wherein said first, second, and third switches of said first plurality of switches are consecutively arranged along said first resistor ladder, and
wherein a first switch of the second plurality of switches is turned on, followed by a second switch of the second plurality of switches turned off, followed by a third switch of the second plurality of switches turned on, wherein said first, second, and third switches of said second plurality of switches are consecutively arranged along said second resistor ladder, wherein the second switch is disposed in-between the first switch and the third switch.

8. The programmable gain attenuator of claim 7, wherein the first switch of the first plurality of switches includes a plurality of switches, and wherein the first switch of the second plurality of switches includes a plurality of switches.

9. The programmable gain attenuator of claim 7, wherein the second switch of the first plurality of switches includes a plurality of switches, and wherein the second switch of the second plurality of switches includes a plurality of switches.

10. The programmable gain attenuator of claim 7, wherein the third switch of the first plurality of switches includes a plurality of switches, and wherein the third switch of the second plurality of switches includes a plurality of switches.

11. The programmable gain attenuator of claim 7, further including a plurality of resistors connected between the corresponding taps of the first and second resistor ladders.

* * * * *